(12) United States Patent
Bridger et al.

(10) Patent No.: US 9,157,169 B2
(45) Date of Patent: Oct. 13, 2015

(54) PROCESS FOR MANUFACTURE OF SUPER LATTICE USING ALTERNATING HIGH AND LOW TEMPERATURE LAYERS TO BLOCK PARASITIC CURRENT PATH

(75) Inventors: Paul Bridger, Altadena, CA (US);
Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 964 days.

(21) Appl. No.: 11/531,508

(22) Filed: Sep. 13, 2006

(65) Prior Publication Data
US 2007/0056506 A1     Mar. 15, 2007

Related U.S. Application Data

(60) Provisional application No. 60/717,102, filed on Sep. 14, 2005.

(51) Int. Cl.
| C30B 25/02 | (2006.01) |
| C30B 23/00 | (2006.01) |
| C30B 29/40 | (2006.01) |
| H01L 33/04 | (2010.01) |
| C30B 23/06 | (2006.01) |
| C30B 25/10 | (2006.01) |
| C30B 25/16 | (2006.01) |
| H01L 21/02 | (2006.01) |

(52) U.S. Cl.
CPC ............. *C30B 23/002* (2013.01); *C30B 23/063* (2013.01); *C30B 25/02* (2013.01); *C30B 25/10* (2013.01); *C30B 25/16* (2013.01); *C30B 29/403* (2013.01); *H01L 21/0237* (2013.01); *H01L 21/0254* (2013.01); *H01L 21/0262* (2013.01); *H01L 21/02458* (2013.01); *H01L 21/02505* (2013.01); *H01L 21/02507* (2013.01); *H01L 33/04* (2013.01)

(58) Field of Classification Search
CPC ...... C30B 23/00; C30B 25/02; C30B 29/403; H01L 21/054; H01L 21/02458; H01L 21/0262; H01L 33/04
USPC .......................... 117/84, 88, 89, 93, 105, 952
See application file for complete search history.

(56) References Cited

U.S. PATENT DOCUMENTS

| 6,171,394 B1 | 1/2001 | Watanabe et al. |
| 6,488,771 B1 | 12/2002 | Powell et al. |
| 6,596,079 B1 | 7/2003 | Vaudo et al. |
| 6,673,149 B1 * | 1/2004 | Solomon et al. ................ 117/90 |
| 7,192,849 B2 | 3/2007 | Fareed |
| 7,479,658 B2 | 1/2009 | Sakai |
| 2001/0002048 A1 * | 5/2001 | Koike et al. .................... 257/80 |

(Continued)

FOREIGN PATENT DOCUMENTS

| CN | 1322006 | 11/2001 |
| CN | 1505843 | 6/2004 |

(Continued)

OTHER PUBLICATIONS

Search Report dated Aug. 1, 2007 for International Appln. No. PCT/US06/35800.

*Primary Examiner* — Matthew Song
(74) *Attorney, Agent, or Firm* — Farjami & Farjami LLP

(57) ABSTRACT

A method for fabricating a III-nitride semiconductor body that includes high temperature and low temperature growth steps.

15 Claims, 4 Drawing Sheets

(56) References Cited

U.S. PATENT DOCUMENTS

| | | | |
|---|---|---|---|
| 2005/0009221 A1* | 1/2005 | Miyoshi et al. | 438/22 |
| 2005/0028888 A1* | 2/2005 | Sakai et al. | 148/33 |
| 2005/0263791 A1* | 12/2005 | Yanagihara et al. | 257/194 |

FOREIGN PATENT DOCUMENTS

| | | | | |
|---|---|---|---|---|
| EP | 0881667 | 12/1998 | | |
| JP | H 11-298039 | 10/1999 | | |
| JP | 2001-160627 | 6/2001 | | |
| JP | 2002-069645 | 3/2002 | | |
| JP | 2002-75871 | 3/2002 | | |
| JP | 2002-313733 | 10/2002 | | |
| JP | 2003-110137 | 4/2003 | | |
| JP | 2003-530707 | 10/2003 | | |
| JP | 2004-508268 | 3/2004 | | |
| JP | 2005-72561 | 3/2005 | | |
| WO | WO 03/063215 | 7/2003 | | |
| WO | WO 2004/019392 A2 * | 3/2004 | | H01L 21/203 |
| WO | WO 2004066393 A1 * | 8/2004 | | H01L 29/778 |
| WO | WO 2005/034253 | 4/2005 | | |

* cited by examiner

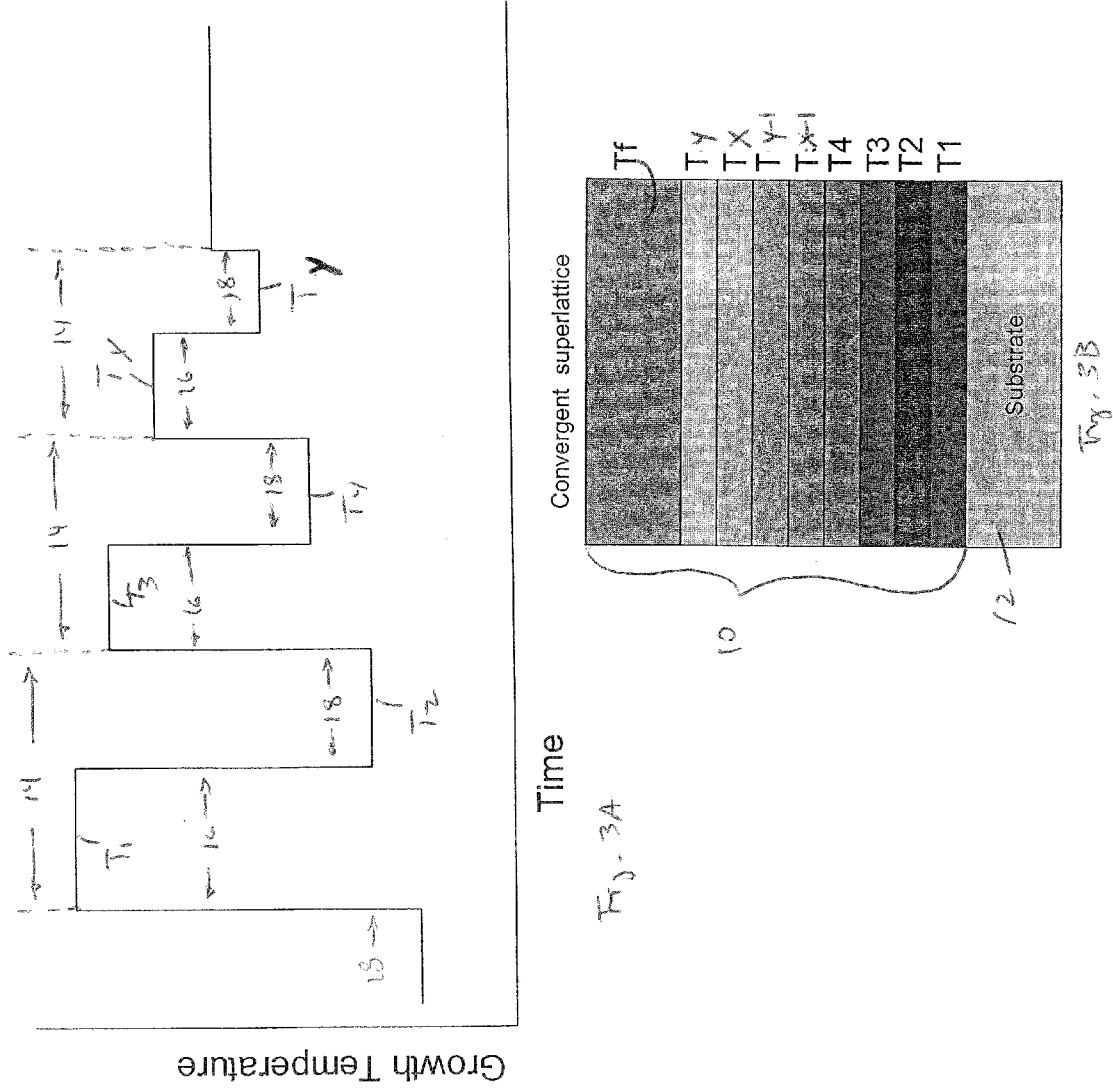

PROCESS FOR MANUFACTURE OF SUPER LATTICE USING ALTERNATING HIGH AND LOW TEMPERATURE LAYERS TO BLOCK PARASITIC CURRENT PATH

RELATED APPLICATION

This application is based on and claims benefit of U.S. Provisional Application Ser. No. 60/717,102, filed on Sep. 14, 2005, entitled Process For Manufacture of Super Lattice Using Alternating High and Low Temperature Layers to Block Parasitic Current Path, to which a claim of priority is hereby made and the disclosure of which is incorporated by reference.

DEFINITION

III-nitride as used herein refers to a semiconductor alloy from the InAlGaN system that includes at least Nitrogen and another alloying element from group III. Examples of a III-nitride alloy are AlN, GaN, AlGaN, InGaN, InAlGaN, or any combination that includes nitrogen or at least one element from group III.

BACKGROUND OF THE INVENTION

The present invention relates to a process for fabricating a power semiconductor device and more particularly a III-nitride power semiconductor device.

A well known III-nitride power semiconductor device includes a substrate, a III-nitride transition layer, and a heterojunction III-nitride device over the transition layer. Such devices have been known to include a parasitic conduction path from the heterojunction device to the substrate. The parasitic conduction path is undesirable in that it undermine the ability of the device to switch current effectively.

It is desirable to minimize the effect of or to eliminate the parasitic conduction path in III-nitride heterojunction devices.

SUMMARY OF THE INVENTION

It is an object of the present invention to provide a process for fabrication of a III-nitride power semiconductor device which does not include a parasitic conduction path.

It is believed that the parasitic conduction as explained above is defect assisted. Therefore, a process according to the present invention involves a method that minimize the defects which assist in the promotion of parasitic conduction paths.

Specifically, a method according to the present invention includes providing a substrate, and growing a III-nitride body over a major surface of the substrate to a final thickness over a growth period of time, wherein the growth temperature is varied over the growth period of time.

In one variation of the present invention, the growth temperature is varied in cycles, each cycle including a period of high temperature growth at a high temperature and a period of low temperature growth at a low temperature.

In one embodiment of the present invention, the high temperature and the low temperature in all cycle are the same.

In another embodiment of the present invention, the low temperature in each cycle is varied, while the high temperature remains the same from cycle to cycle.

In yet another embodiment of the present invention, the low temperature and the high temperature are varied in each cycle until the two temperatures converge.

In all of the embodiments, the period of time for the low temperature or the high temperature in each cycle can be varied as desired.

In another variation of the present invention, the growth temperature is continuously varied either in an ascending direction or in a descending direction.

Other features and advantages of the present invention will become apparent from the following description of the invention which refers to the accompanying drawings.

BRIEF DESCRIPTION OF THE DRAWING(S)

FIGS. 3A and 3B illustrate a method according to the third embodiment of the present invention.

Figures 4B, 5:
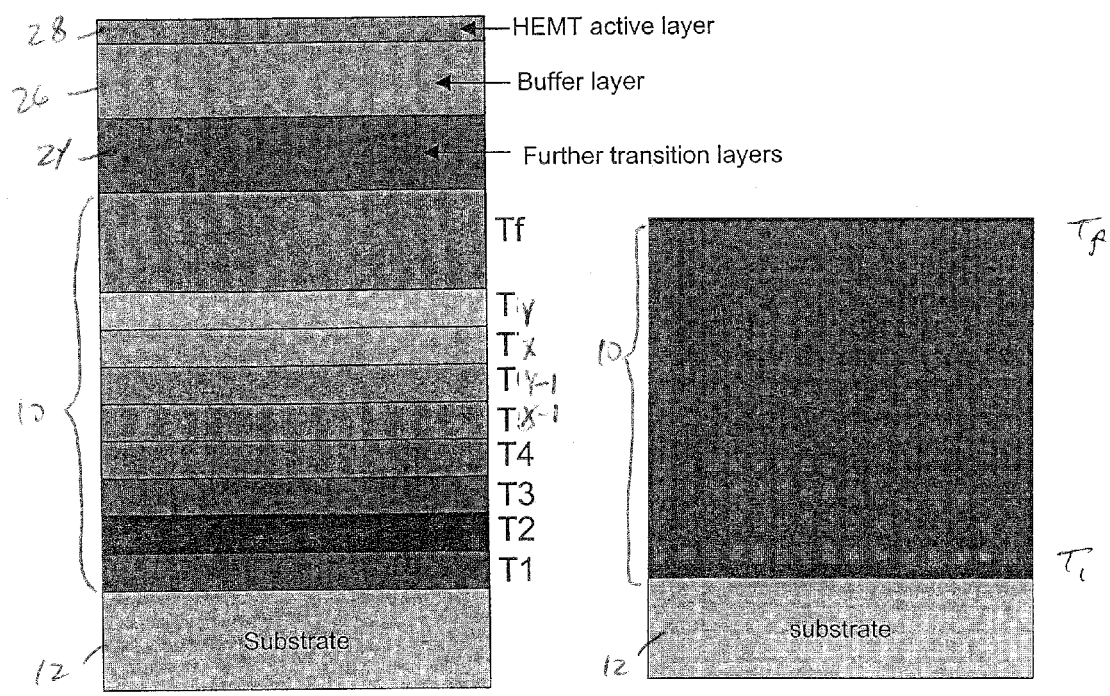

FIG. 5 schematically illustrates an example of a III-nitride device fabricated according to the present invention.

DETAILED DESCRIPTION OF THE FIGURES

Figure 1A:
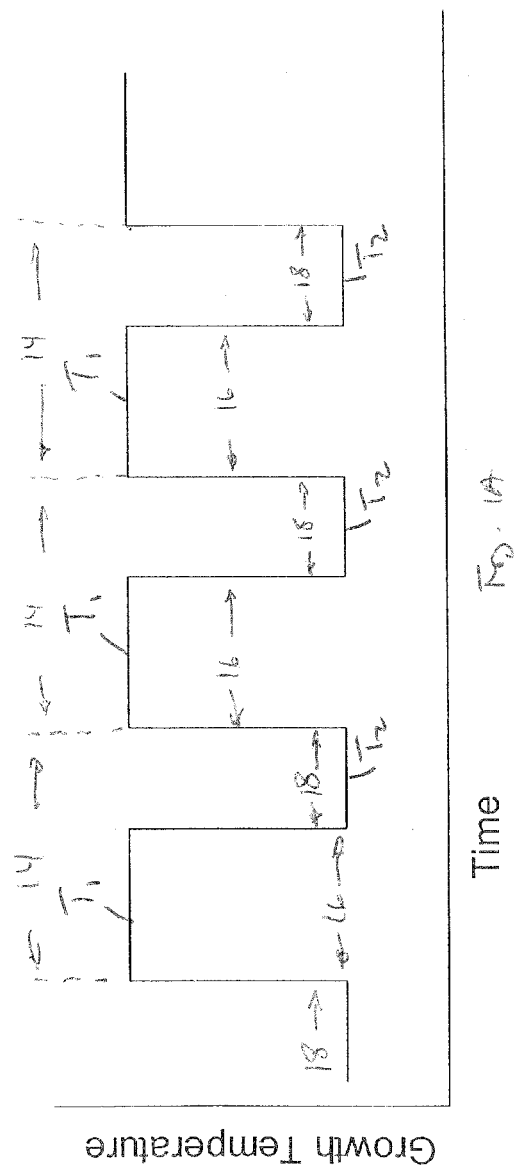
FIGS. 1A and 1B illustrate a method according to the first embodiment of the present invention.
Figure 1B:
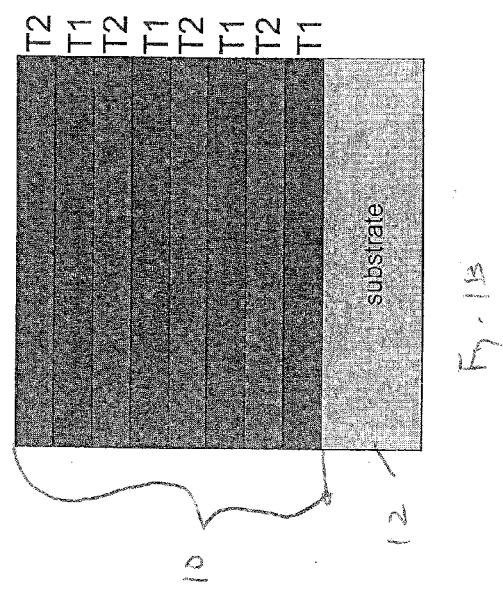

Referring to FIGS. 1A-1B, in a process according to the first embodiment of the present invention a III-nitride super lattice body 10 (e.g. AlN body) is grown on a substrate 12 by varying the growth temperature over a growth period of time. Specifically, the growth temperature is varied in cycles, each cycle 14 including a period of high temperature growth followed by a period of low temperature growth. Thus, as illustrated in FIG. 1A graphically a III-nitride semiconductor body is grown for a first period of time 16 at a high temperature $T_1$ (e.g. 1000° C.), and then another III-nitride body is grown for a second period of time 18 at a lower temperature $T_2$ (e.g. 800° C.). Growth cycle 14 is then repeated until a III-nitride super lattice body of a desired thickness is obtained.

It should be noted that it has been observed that the best results can be achieved if a process according to the present invention starts with a low temperature growth step first. Thus, it is preferred that a process according to the present invention starts with a low temperature growth step and then followed with other steps as explained in relation to the embodiments described below.

In a method according to the first embodiment, high growth temperature $T_1$ in all cycles are equal to one another, and low growth temperature $T_2$ in all cycles are equal to one another. Note that first period of time 16 in all cycles may be equal to one another and even equal to second period of time 18 in all cycles. Similarly, second period of time in all cycles 14 may be equal to one another. First and second periods of time 16, 18 may also be varied as desired.

Figure 2A:
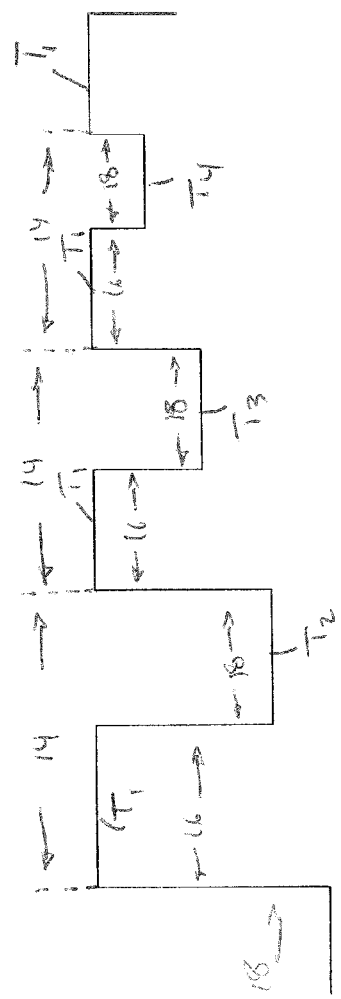
FIGS. 2A and 2B illustrate a method according to the second embodiment of the present invention.
Figure 2B:
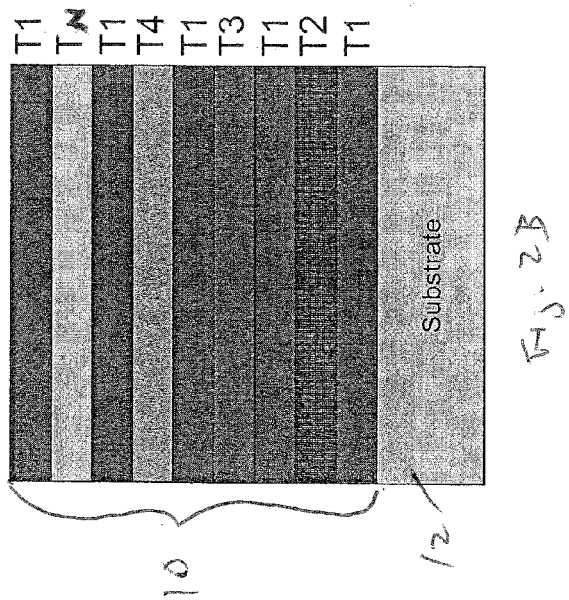

Referring to FIGS. 2A and 2B, in a method according to the second embodiment of the present invention, high growth temperature $T_1$ in all cycles 14 are equal, while low growth temperatures $T_2, T_3, T_4, \ldots T_N$ (N=an integer representing the last III-nitride body formed during a low temperature growth step) are different from one another. Preferably, low growth temperatures start from a low value ($T_1$) and are increased in each step to a higher temperature.

Referring now to FIGS. 3A and 3B, in a method according to the third embodiment of the present invention, high growth temperature and low growth temperature in each cycle is varied, whereby preferably the two growth temperatures converge with every cycle. Thus, in the first cycle $T_1$ is the high growth temperature while $T_2$ is the low growth temperature. In the next cycle $T_3$ is the high growth temperature and $T_4$ is the low growth temperature. The cycles are repeated until $T_X$ (last high growth temperature) and $T_Y$ (last low growth temperature are reached). To converge the two growth temperatures the high growth temperature is lowered while the low growth temperature is increased in each cycle. Thus, $T_1 > T_3$ while $T_2 < T_4$ until preferably a final growth temperature $T_f$ is reached after reaching $T_X$ and $T_Y$.

Figure 4A:
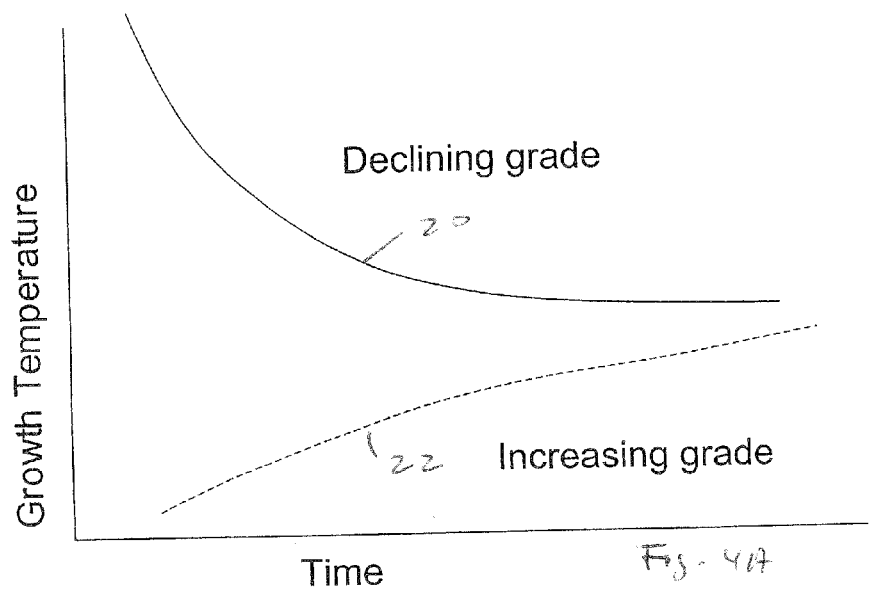
FIGS. 4A and 4B illustrate a method according to the fourth embodiment of the present invention.

Referring now to FIGS. 4A and 4B, in a method according to the fourth embodiment of the present invention, the growth temperature is varied continuously until a desired thickness is obtained. For example, the growth temperature can start from a high value and descend continuously to a low value (curve 20) or start from a low growth temperature and ascend to a high value (curve 22).

Referring to FIG. 5, a III-nitride device can be formed over a III-nitride super lattice that is formed according to the present invention. For example, a device can be formed over a III-nitride super lattice 10 that is formed according to the third embodiment of the present invention (or other embodiments) as illustrated in FIG. 5. Such a III-nitride device may include a III-nitride transition layer (or layers) 24, a III-nitride buffer layer 26, and a III-nitride active layer 28 which may constitute the active region for a high electron mobility transistor (HEMT). It should be noted that a device according to the present invention is not limited to a HEMT. Other devices such as III-nitride MISFETs, MISHFETs, HEMFETs, HJFET or the like may also be formed on a III-nitride super lattice 10 formed according to the present invention.

Furthermore, it should be noted that in a process according to the present invention the alloy composition can be changed as the temperature is varied. Thus, for example, the alloy composition of one III-nitride semiconductor body grown at a high temperature can be different from the alloy composition of another III-nitride body grown at a low temperature. In another variation, the alloy composition in the body of a III-nitride body grown at high temperature or low temperature can be varied as well; i.e. a III-nitride body can have a varying alloy composition.

In a method according to the present invention substrate 12 may be composed of silicon, sapphire, a III-nitride substrate such as a GaN substrate, silicon carbide or the like. Silicon, however, is a preferred substrate for economic reasons.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a power field-effect transistor (power FET), comprising:
   providing a substrate;
   growing a III-nitride body comprising aluminum nitride (AlN) over a major surface of said substrate to a final thickness over a growth period of time, wherein growth temperature is started at a low growth temperature and varied in cycles thereafter over said growth period of time, each cycle including a period of high temperature growth at a high temperature and a period of low temperature growth at a low temperature;
   said high temperature and said low temperature converging during said growth period of time until said high temperature and said low temperature are substantially equal to a final growth temperature of said III-nitride body;
   said III-nitride body being a superlattice structure wherein a number of layers grown at said high temperature is equal to a number of layers grown at said low temperature;
   forming a buffer layer over said III-nitride body;
   forming an active layer on said buffer layer, said active layer providing an active region for said power FET;
   said buffer layer and said III-nitride body being provided to resist current flow outside said active layer.

2. The method of claim 1, wherein said low temperature in each cycle is varied.

3. The method of claim 1, wherein said high temperature in each cycle is varied.

4. The method of claim 1, wherein said low temperature and said high temperature in each cycle are varied.

5. The method of claim 1, wherein said high temperature in each cycle is the same.

6. The method of claim 1, wherein said low temperature in each cycle is the same.

7. The method of claim 1, wherein said period of said high temperature growth is varied.

8. The method of claim 1, wherein said period of said low temperature growth is varied.

9. The method of claim 1, wherein said period of said high temperature growth and said period of said low temperature growth are varied.

10. The method of claim 1, wherein said period of said high temperature growth is equal to said period of said low temperature growth.

11. The method of claim 1, wherein said period of said high temperature growth is different than said period of said low temperature growth.

12. The method of claim 1, wherein said growth temperature is varied continuously.

13. The method of claim 1, wherein said growth temperature is varied in discrete steps.

14. The method of claim 1, wherein said high growth temperature and said low growth temperature converge with each growth cycle.

15. The method of claim 1, wherein the alloy composition of said III-nitride body is varied during said growing step.

* * * * *